(12) United States Patent
Song

(10) Patent No.: US 6,479,905 B1
(45) Date of Patent: Nov. 12, 2002

(54) FULL CMOS SRAM CELL

(75) Inventor: Jun-eui Song, Suwon (KR)

(73) Assignee: Samsung Electronics Co., Ltd. (KR)

( * ) Notice: Subject to any disclaimer, the term of this patent is extended or adjusted under 35 U.S.C. 154(b) by 127 days.

(21) Appl. No.: 09/620,666

(22) Filed: Jul. 20, 2000

(30) Foreign Application Priority Data

Jul. 20, 1999 (KR) ............................................ 99-29284

(51) Int. Cl.$^7$ .............................................. H01L 27/11
(52) U.S. Cl. ...................................... 257/903; 257/904
(58) Field of Search ................................ 257/903, 904, 257/365, 371, 393, 202.2; 438/257, 381–399

(56) References Cited

U.S. PATENT DOCUMENTS

| | | | | |
|---|---|---|---|---|
| 5,654,915 A | * | 8/1997 | Stolmeijer et al. | 365/156 |
| 5,742,078 A | * | 4/1998 | Lee et al. | 257/202 |
| 6,127,704 A | * | 10/2000 | Kim | 257/365 |
| 6,160,298 A | * | 12/2000 | Ohkubo | 257/393 |
| 6,204,538 B1 | * | 3/2001 | Kim | 257/365 |

* cited by examiner

Primary Examiner—David Nelms
Assistant Examiner—Long K. Tran
(74) Attorney, Agent, or Firm—Mills & Onello LLP

(57) ABSTRACT

A full CMOS SRAM cell includes first and second active regions formed in a semiconductor substrate. A word line traverses first and second areas of the second active region, and first and second gate electrodes are arranged to be perpendicular to the word line. The first and second gate electrodes are parallel to each other and traverse the first and second active regions, respectively. A power line is electrically connected to a first common source region and is arranged parallel to the word line, the first common source region being the first active region between the first gate electrode and the second gate electrode. A ground line is electrically connected to a second common source region and is arranged parallel to the word line, the second common source region being the second active region between the first gate electrode and the second gate electrode. First and second bit lines are arranged to be perpendicular to the word line and parallel to each other.

10 Claims, 10 Drawing Sheets

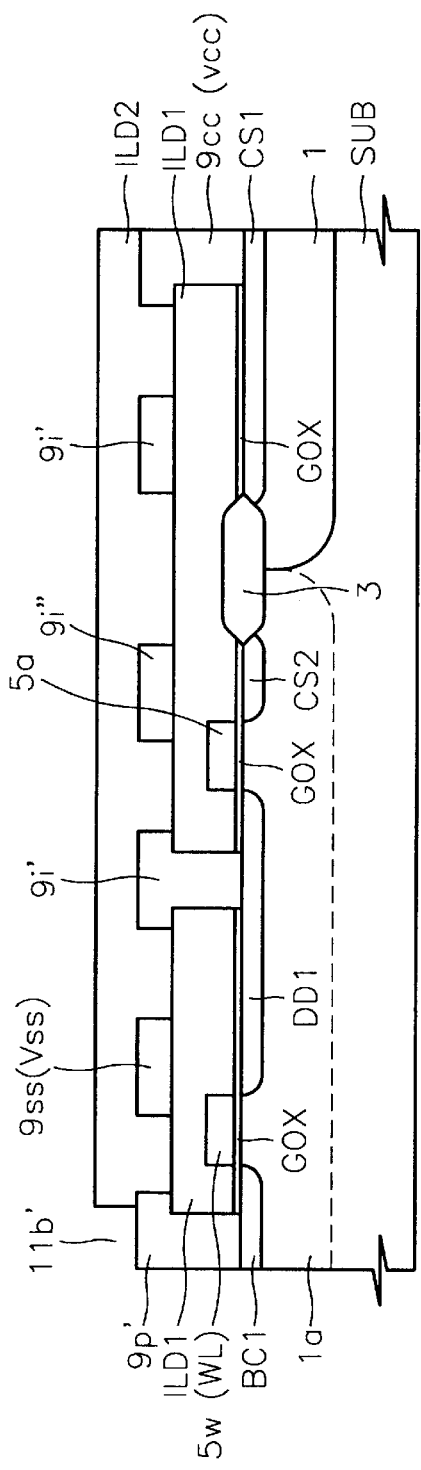
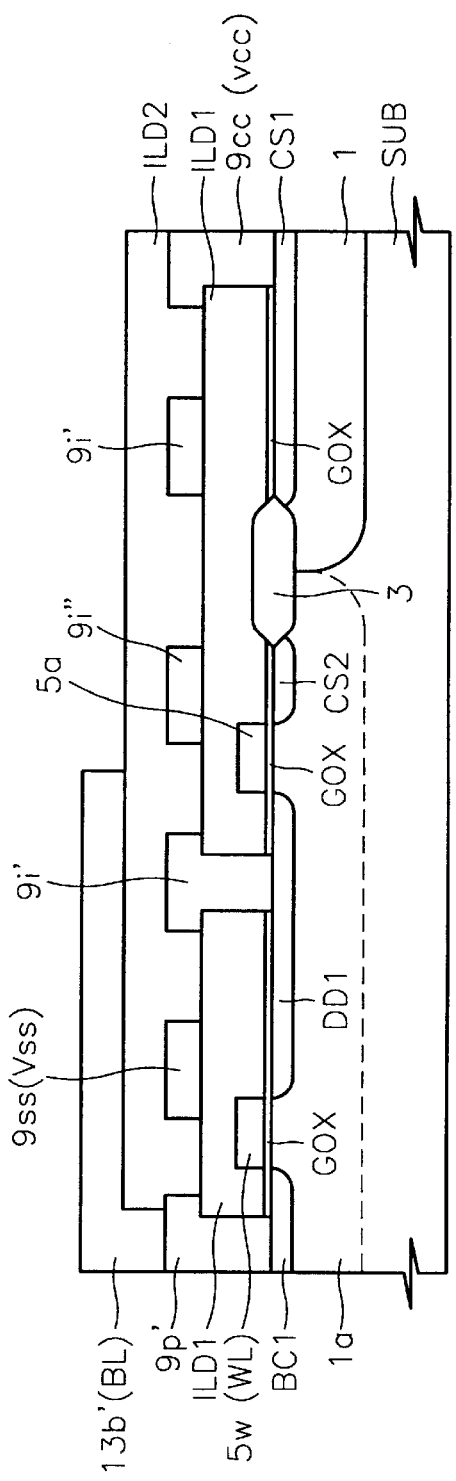

FULL CMOS SRAM CELL

BACKGROUND OF THE INVENTION

1. Field of the Invention

The present invention relates to a semiconductor device, and more particularly, to a full complementary metal oxide semiconductor (CMOS) static random access memory (SRAM) cell.

2. Description of the Related Art

Among semiconductor memory devices, static random access memories (SRAMs) consume less power than and operate faster than dynamic random access memories (DRAMs). Thus, SRAMs are widely used for cache memory devices for computers or portable electronic products.

Memory cells for SRAMs are largely divided into two types; one is a high load resistor cell having a high resistance as its load element, and the other is a CMOS cell having a PMOS transistor as its load element. CMOS cells are subdivided into two types; one is a thin film transistor cell having a thin film transistor as its load element, and the other is a fall CMOS cell having a bulk transistor as its load element.

FIG. 1 is a schematic equivalent circuit diagram of a general CMOS cell. Referring to FIG. 1, the CMOS cell includes a pair of driver transistors TD1 and TD2, a pair of transfer transistors TA1 and TA2, and a pair of load transistors TL1 and TL2. In the circuit shown in FIG. 1, the pair of driver transistors TD1 and TD2 and the pair of transfer transistors TA1 and TA2 are all NMOS transistors, while the pair of load transistors TL1 and TL2 are both PMOS transistors.

The first driver transistor TD1 and the first transfer transistor TA1 are serially connected to each other. A source region of the first driver transistor TD1 is connected to a ground line Vss, and a drain region of the first transfer transistor TA1 is connected to a first bit line BL. Likewise, the second driver transistor TD2 and the second transfer transistor TA2 are serially connected to each other. A source region of the second driver transistor TD2 is connected to the ground line Vss, and a drain region of the second transfer transistor TA2 is connected to a second bit line/BL. The second bit line/BL retains the inverted information of the first bit line BL.

Source and drain regions of the first load transistor TL1 are connected to a power line Vcc and a drain region of the first driver transistor TD1 at a first node, respectively. Likewise, source and drain regions of the second load transistors TL2 are connected to the power line Vcc and a drain region of the second driver transistor TD2 at a second node, respectively. A gate electrode of the first driver transistor TD1 and a gate electrode of the first load transistor TL1 are both connected to the second node. A gate electrode of the second driver transistor TD2 and a gate electrode of the second load transistor TL2 are both connected to the first node. Also, gate electrodes of the first and second transfer transistors TA1 and TA2 are connected to a word line WL.

The above-described CMOS cell has a small standby current and a large noise margin compared to the load resistor cell. Thus, CMOS cells are widely used for high-performance SRAMs which require a low power voltage.

Equivalent circuits of the CMOS SRAM cell shown in FIG. 1 can be implemented on semiconductor substrates in various configurations. In particular, in SRAMs, the parasitic capacitance of a bit line is closely related to the operating speed of an SRAM device. Therefore, the parasitic capacitance of a bit line must be designed to be as small as possible, and the resistance of a bit line must be low. As a result, it is often desirable that bit lines and the spaces between them be wide, i.e., that the bit lines high large pitch.

SUMMARY OF THE INVENTION

It is an object of the present invention to provide a full CMOS SRAM cell which can maximize the pitch of bit lines.

The present invention provides a full complementary metal oxide semiconductor (CMOS) static random access memory (SRAM) cell including first and second active regions formed in a semiconductor substrate. A word line traverses first and second areas of the second active region, and first and second gate electrodes are arranged to be perpendicular to the word line. The first and second gate electrodes are parallel to each other and traverse the first and second active regions, respectively. A power line is electrically connected to a first common source region and is arranged parallel to the word line. The first common source region is the first active region between the first gate electrode and the second gate electrode. A ground line is electrically connected to a second common source region and is arranged parallel to the word line. The second common source region is the second active region between the first gate electrode and the second gate electrode. First and second bit lines are arranged to be perpendicular to the word line and parallel to each other.

In one embodiment, the first and second active regions can be formed in a first conductivity type well and a second conductivity type well, respectively. The first and second conductivity types can be N-type and P-type, respectively.

In one embodiment, the first active region can be formed in a "T" shape. The second active region can be formed in an upside-down or inverted "T" shape symmetrical with the first active region. The second active region can include extending portions which extend from ends of both wings of the inverted "T" shape in a direction opposite to the first active region. The word line can traverse the extending portions of the second active region.

The word line, the first gate electrode and the second gate electrode can be formed by patterning a first conductive layer. The ground line and the power line can be formed of a second conductive layer different from the first conductive layer. Here, the word line may be formed of a conductive layer different from the first and second gate electrodes. Also, the first and second bit lines can be formed of a third conductive layer different from the first and second conductive layers.

The full CMOS SRAM cell can further include a first local interconnection for electrically connecting a portion of the second active region, a portion of the first active region and the second gate electrode, wherein the part of the second active region faces the second common source region among the second active regions at both sides of the, first gate electrode, and the part of the first active region faces the first common source region among the first active regions at both sides of the first gate electrode. The full CMOS SRAM cell can also include a second local interconnection for electrically connecting a portion of the second active region, a portion of the first active region and the first agate electrode, wherein the part of the second active region faces the second common source region among the second active regions at both sides of the second gate electrode and the part of the first active region faces the first common source region among the first active region at both sides of the second gate electrode. Here, the first and second active regions electrically connected to the second gate electrode correspond to a first node region, and the first-and second active regions electrically connected to the first gate electrode correspond to a second node region. In one embodiment, the first and second local interconnections can be formed of a second conductive layer. Also, in one embodiment, the first and second bit lines can be formed of a third conductive layer.

The word line and the second active region traversing the word line constitute first and second transfer transistors. The first gate electrode and the second active region traversing the first gate electrode constitute a first driver transistor, and the second gate electrode and the second active region traversing the second gate electrode constitute a second driver transistor. Likewise, the first gate electrode and the first active region traversing the first gate electrode constitute a first load transistor, and the second gate electrode and the first active region traversing the second gate electrode constitute a second load transistor. Consequently, the first and second load transistors are serially connected to each other in the first active region, and the first transfer transistor, the first driver transistor, the second driver transistor and the second transfer transistor are sequentially serially connected in the second active region.

The first and second driver transistors, and the first and second load transistors constitute a latch circuit, together with the first and second local interconnections. Thus, the first node region corresponds to the drain regions of the first driver transistor and the first load transistor and serves as a source region of the first transfer transistor. Also, the second node region corresponds to the drain regions of the second driver transistor and the second load transistor and serves as a source region of the second transfer transistor.

The first bit line is electrically connected to the drain region of, the first transfer transistor, that is, the first bit line contact region, and the second bit line is electrically connected to the drain region of the second transfer transistor, that is, the second bit lie contact region.

The first gate electrode serves as a common gate electrode shared by the first transfer transistor and the first load transistor. Likewise, the second gate electrode serves as a common gate electrode shared by the second transfer transistor and the second load transistor.

According to the present invention, only the first and second bit lines exist within a cell 30 pitch as interconnections formed of the third conductive layer. Therefore, the pitch of bit lines can be maximized. As a result, the parasitic capacitance of a bit line can be minimized, thereby improving the operating speed of the SRAM.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 8 through 13 are schematic cross-sectional views illustrating a method of manufacturing the full CMOS SRAM cell, along the line AA' shown in FIGS. 2 through 7.

DESCRIPTION OF THE PREFERRED EMBODIMENT(S)

Figure 2:
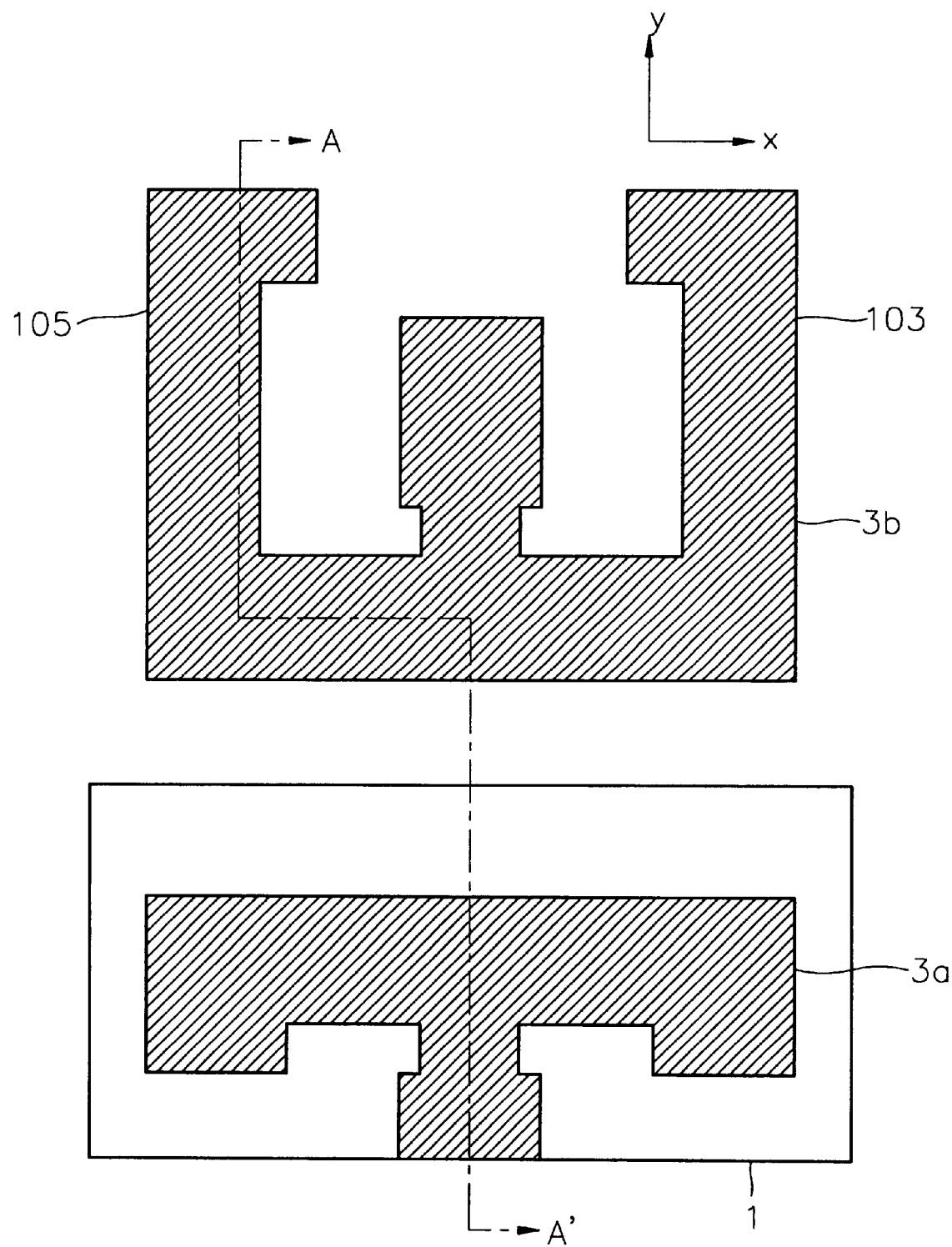
FIGS. 2 through 7 are schematic layout diagrams of one embodiment of a full CMOS SRAM cell according to the present invention.

The structure of one embodiment of a full CMOS SRAM cell according to the present invention will be described with reference to FIGS. 2 through 7. Referring to FIG. 2, first and second active regions 3a and 3b, which are spaced apart from each other, are formed on a semiconductor substrate. The first active region 3a is formed in a first conductivity type well 1, e.g., an N-type well, and the second active region 3b is formed in a second conductivity type well, e.g., a P-type well. Here, the second conductivity type well may be a P-type semiconductor substrate. Conversely, the second active region 3b may be formed in the second conductivity type well, e.g., a P-type well. In this case, the first active region 3a is formed in an N-type well or N-type semiconductor substrate.

The first active region 3a is formed in a "T" shape, and the second active region 3b is formed in an upside-down or inverted "T" shape symmetrical with the first active region 3a with respect to the x-axis. Here, the second active region 3b has extending portions 103 and 105 which extend from both ends of the wings of the second active region 3b, in a direction opposite to the first active region 3a, that is, in the +y-axis direction.

Figure 3:
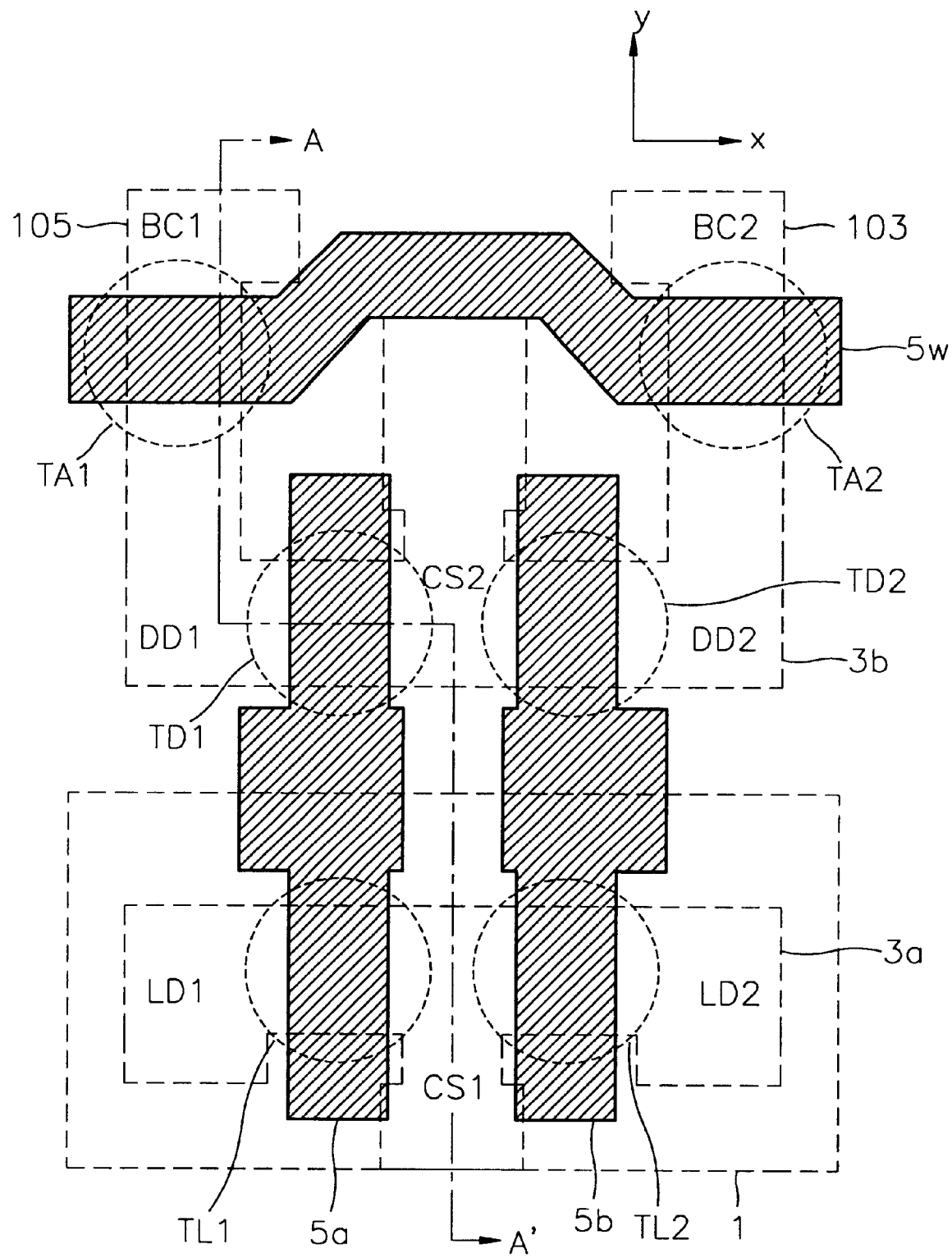

Referring to FIG. 3, a first gate electrode 5a is arranged to traverse the left wing of the first active region 3a and the left wing-of the second active region 3b, and a second gate electrode 5b is arranged to traverse the right wing of the first active region 3a and the right wing of the second active region 3b. Therefore, the first and second gate electrodes 5a and 5b are arranged parallel to the y-axis. Also, a word line 5w is arranged parallel to the x-axis, traversing first and second areas of the second active region 3b. The first and second areas correspond to a predetermined area of the left extending portion 105 of the second active region 3b and a predetermined area of the right extending portion 103 of the second active region 3b, respectively.

The first gate electrode 5a and the first active region 3a at both sides of the first gate electrode 5a constitute a first load transistor TL1, that is, a first PMOS transistor, and the second gate electrode 5b and the first active region 3a at both sides of the second gate electrode 5b constitute a second load transistor TL2, that is, a second PMOS transistor. Here, the first active region 3a positioned in the left of the first gate electrode 5a corresponds to a drain region LD1 of the first load transistor TL1, and the first active region 3a positioned in the right of the second gate electrode 5b corresponds to a drain region LD2 of the second load transistor TL2. Also, the first active region 3a between the first gate electrode 5a and the second gate electrode 5b corresponds to a first common source region CS1 shared by the first and second load transistors TL1 and TL2. The drain region LD1 of the first load transistor TL1, the drain region LD2 of the second load transistor TL2 and the first common source region CS1 are source/drain regions doped with second conductivity type impurities, that is, P-type impurities.

The first gate electrode 5a and the second active region 3b at both sides of the first gate electrode 5a constitute the first driver transistor TD1, and the second gate electrode 5b and the second active region 3b at both sides of the second gate electrode 5b constitute the second driver transistor TD2. The second active region 3b between the word line 5w and the first gate electrode 5a corresponds to a drain region DD1 of the first driver transistor TD1, and the second active region 3b between the word line 5w and the second gate electrode 5b corresponds to a drain region DD2 of the second driver transistor TD2. Also, the second active region 3b between the first gate electrode 5a and the second gate electrode 5b corresponds to a second common source region CS2 shared by the first and second driver transistors TD1 and TD2. The second active regions 3b positioned at the opposite side of the drain regions DD1 and DD2, that is, the ends of the extending portions 105 and 103 of the second active region 3b, correspond to a first bit line contact region BC1 and a second bit line contact region BC2, respectively.

The first and second bit line contact regions BC1 and BC2, the drain regions of the first and second driver transistors TD1 and TD2 and the second common source region CS2 are all first conductivity type impurities, that is, N-type impurity doped regions. Also, the drain region DD1 of the first driver transistor TD1 and the drain region LD1 of the first load transistor TL1 constitute a first node region, and the drain region DD2 of the second driver transistor TD2 and the drain region LD2 of the second load transistor TL2 constitute a second node region.

As described above, the first and second load transistors TL1 and TL2 are serially connected to each other in the first active region 3a, and the first transfer transistor TA1, the first driver transistor TD1, the second driver transistor TD2 and the second transfer transistor TA2 are sequentially serially connected in the second active region 3b.

Figure 4:
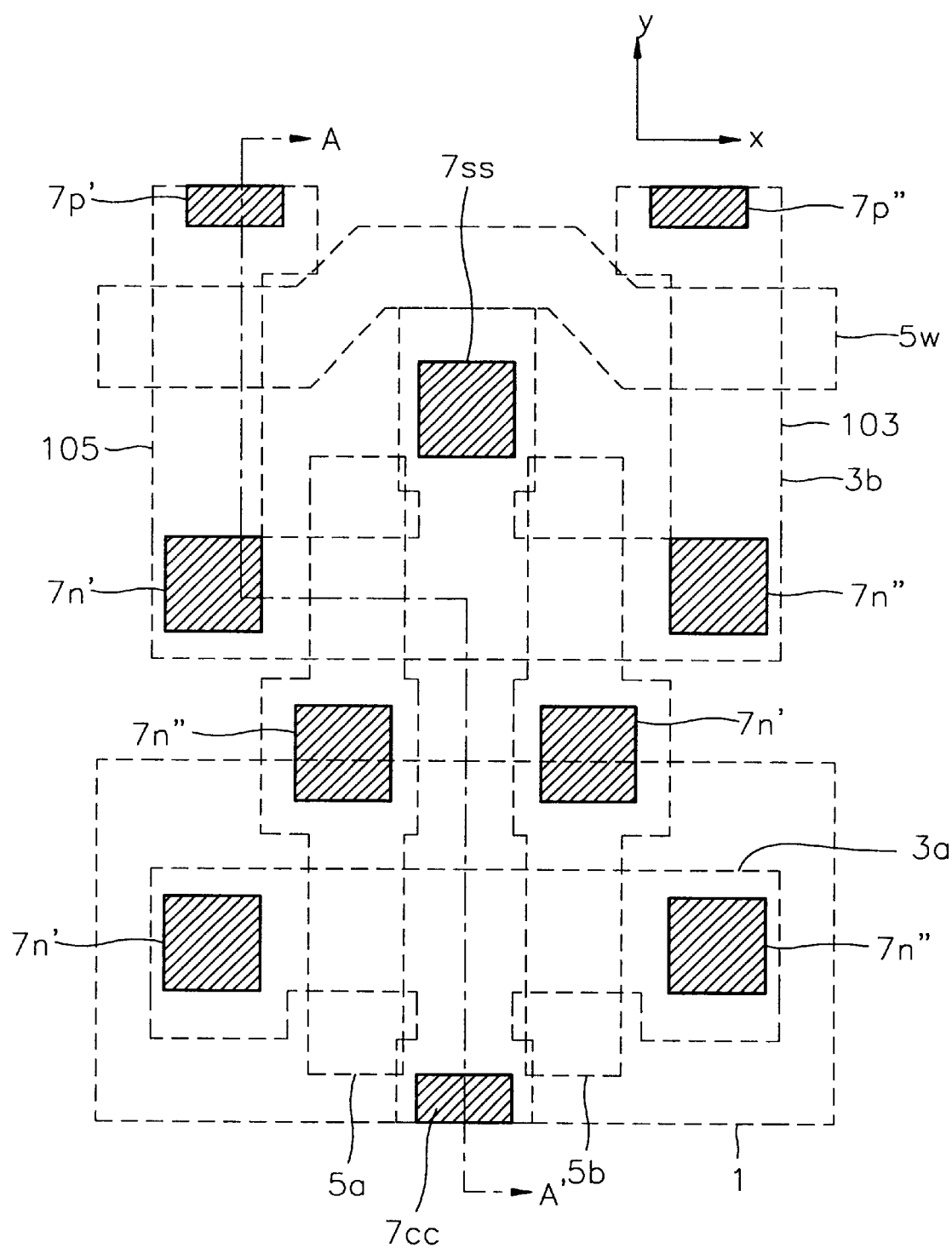
Figure 5:
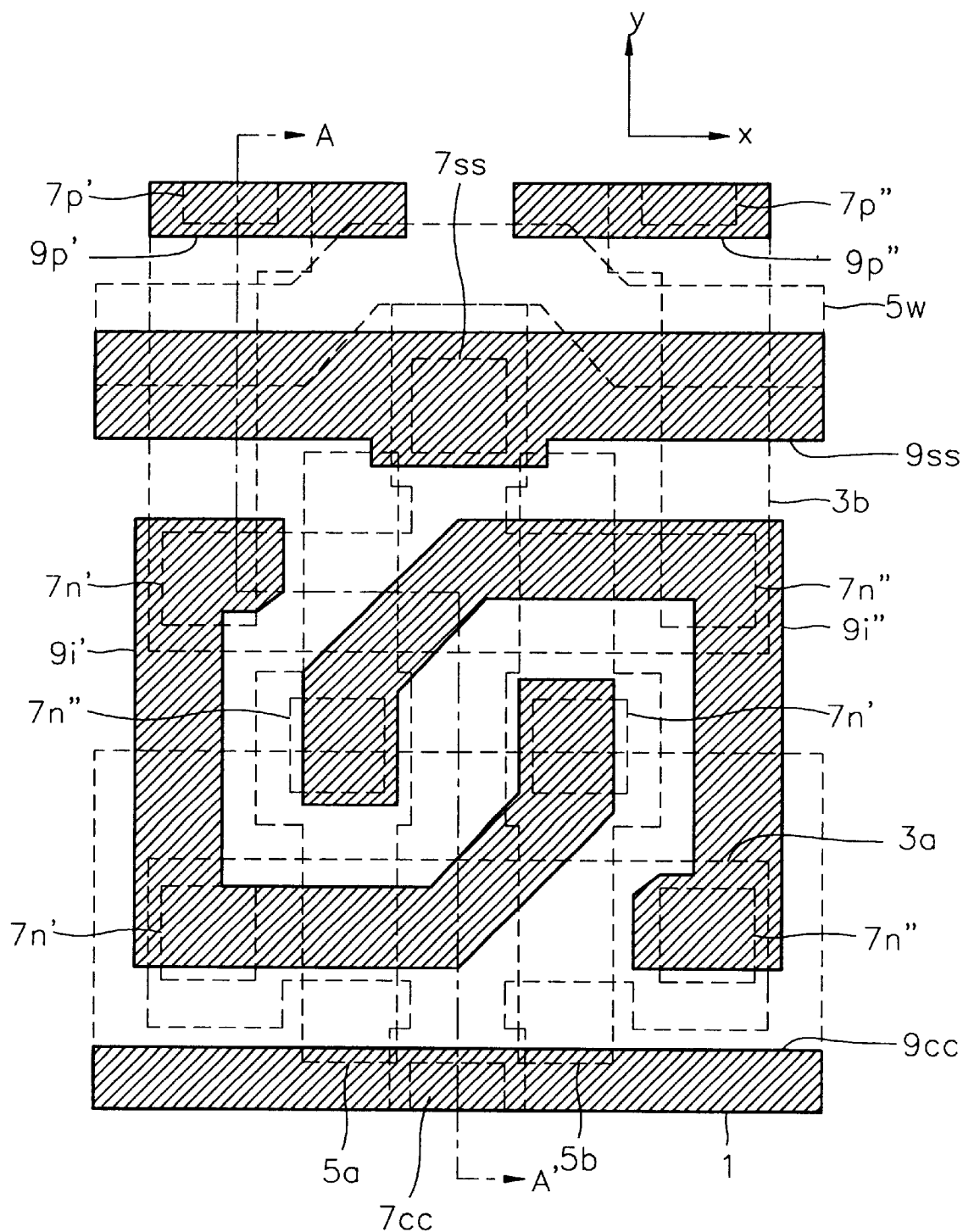

Referring to FIGS. 4 and 5, the first node region and the second gate electrically connected to each other through a first local interconnection 9i', and the second node region and the first gate electrode 5a are electrically connected to each other through a second local interconnection 9i". Accordingly, the first and second driver transistors TD1 and TD2 and the first and second load transistors TL1 and TL2 constitute a latch circuit, together with the first and second local interconnections 9i' and 9". The first local interconnection 9i' electrically connects the first node region to the second gate electrode 5b through first node contact holes 7n' exposing the first node region and the second gate electrode 5b. Likewise, the second local interconnection 9i' electrically connects the second node region to the first gate electrode 5a through second node contact holes 7n" exposing the second node region and the first gate electrode 5a.

The second common source region CS2 is electrically connected to a ground line 9ss parallel to the x-axis through a ground contact hole 7ss. Also, the first common source region CS1 is electrically connected to a power line 9cc parallel to the x-axis through a power contact hole 7cc. A first bit line pad contact hole 7p' exposing the first bit line contact region BC1 is positioned on the first bit line contact region BC1, and a second bit line pad contact hole 7p" exposing the second bit line contact region BC2 is positioned on the second bit line contact region BC2. A first bit line pad 9p' and a second bit line pad 9p" contacting the first bit line contact region BC1 and the second bit line contact region BC2, respectively, through the first and second bit line pad contact holes 7p' and 7p", respectively, are arranged over the first and second bit line contact regions BC1 and BC2.

Figure 6:
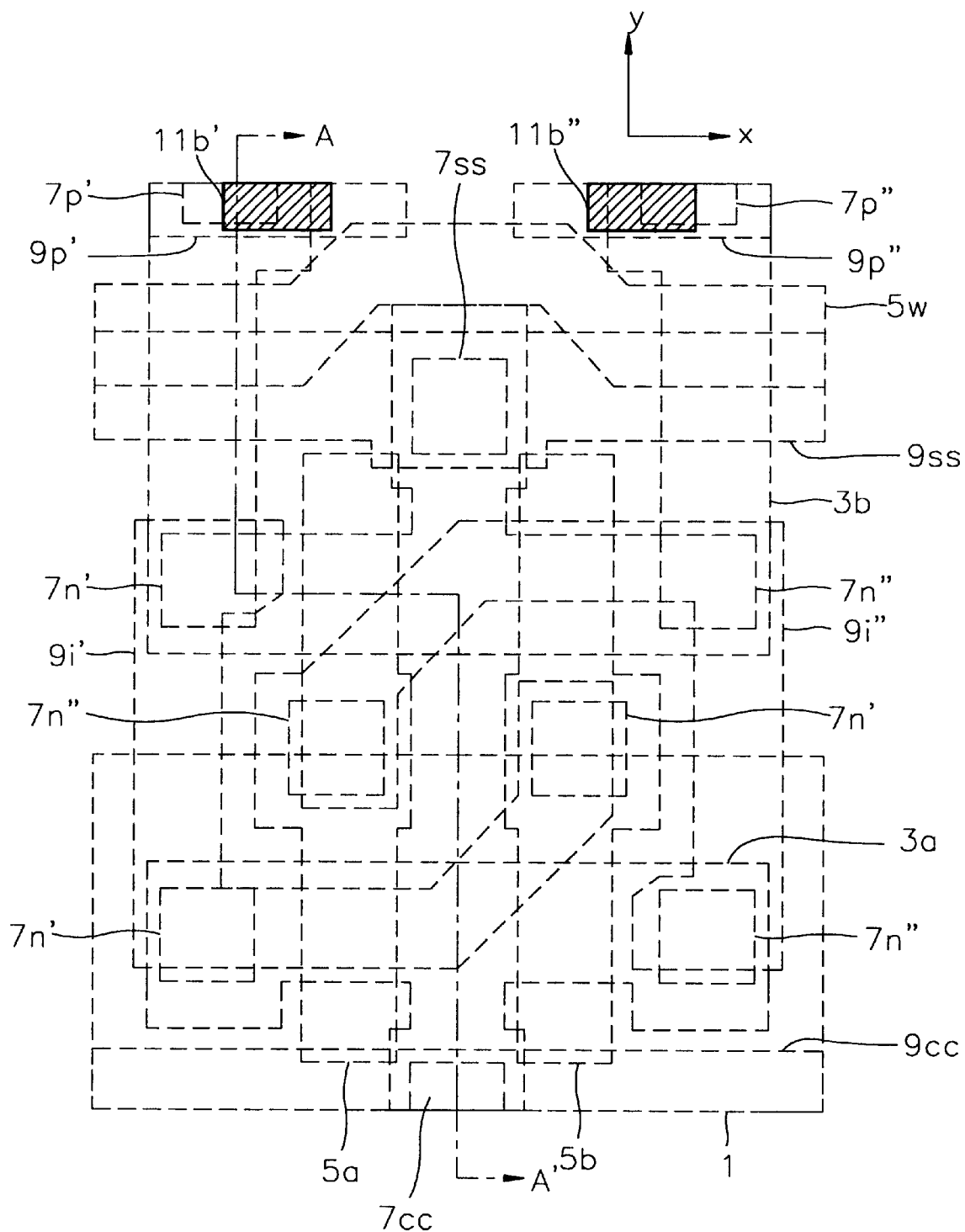
Figure 7:
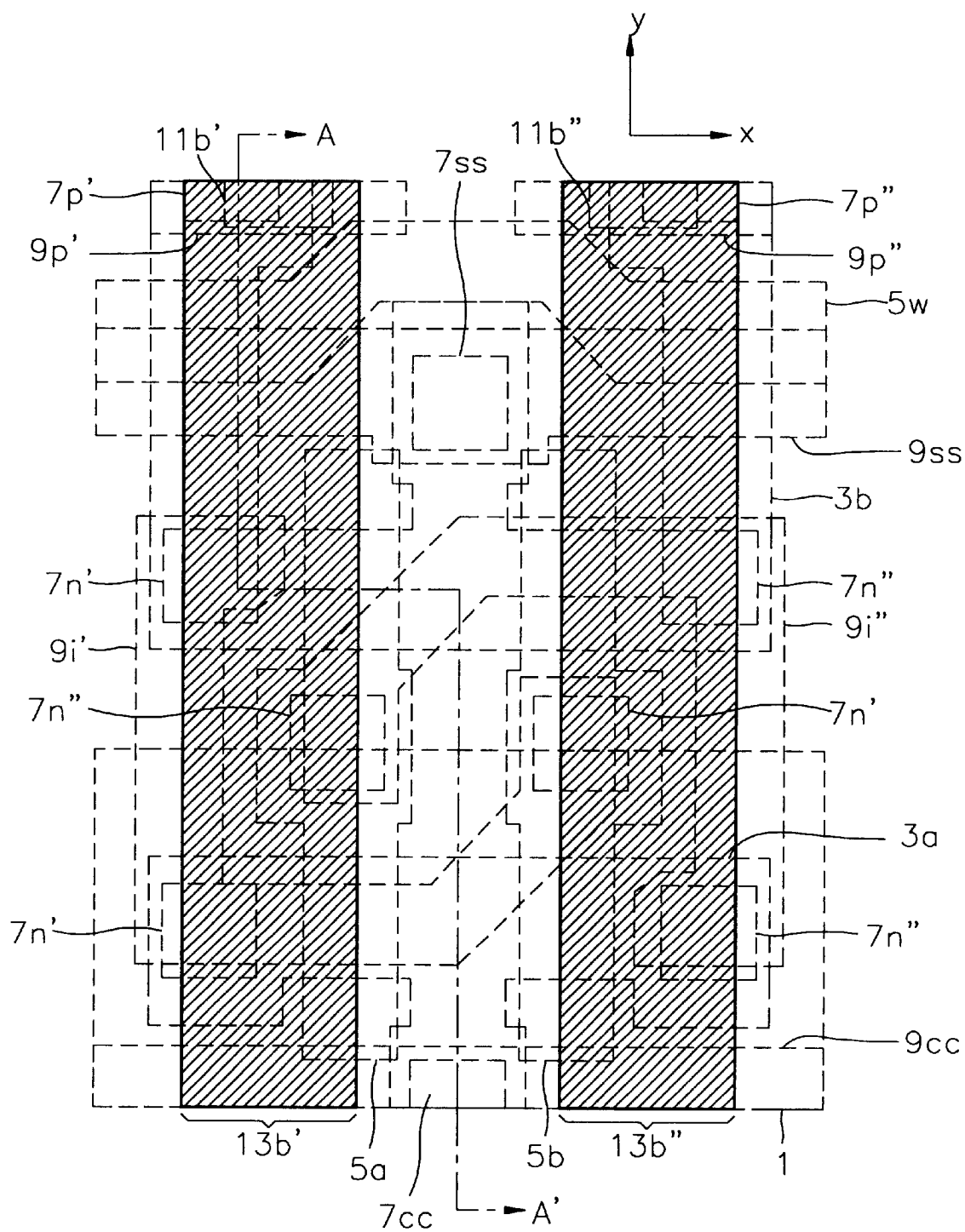

Referring to FIGS. 6 and 7, first and second bit line contact holes 11b' and 11b" exposing the first and second bit line pads 9p' and 9p" are arranged over the first and second bit line pads 9p' and 9p". A first bit line 13b' electrically connected to the first bit line pad 9p' through the first bit line contact hole 11b' is arranged parallel to the y-axis. Likewise, a second bit line 13b" electrically connected to the second bit line pad 9p" through the second bit line contact hole 11b" is arranged parallel to the y-axis.

The first and second bit lines 13b' and 13b" may be directly connected to the first and second bit line contact regions BC1 and BC2, instead of being connected through the first and second bit line pads 9p' and 9p" and the first and second bit line contact holes 11b' and 11b". Here, the first and second bit line pad contact holes 7p' and 7p" serve as the first and second bit line contact holes 11b' and 11b".

Next, a method of manufacturing a full CMOS SRAM cell according to the present invention will be described with reference to FIGS. 8 through 13. FIGS. 8 through 13 are cross-sectional views, taken along the line AA' shown in FIGS. 2 through 7, for explaining a method of manufacturing the full CMOS SRAM cell.

Figure 8:
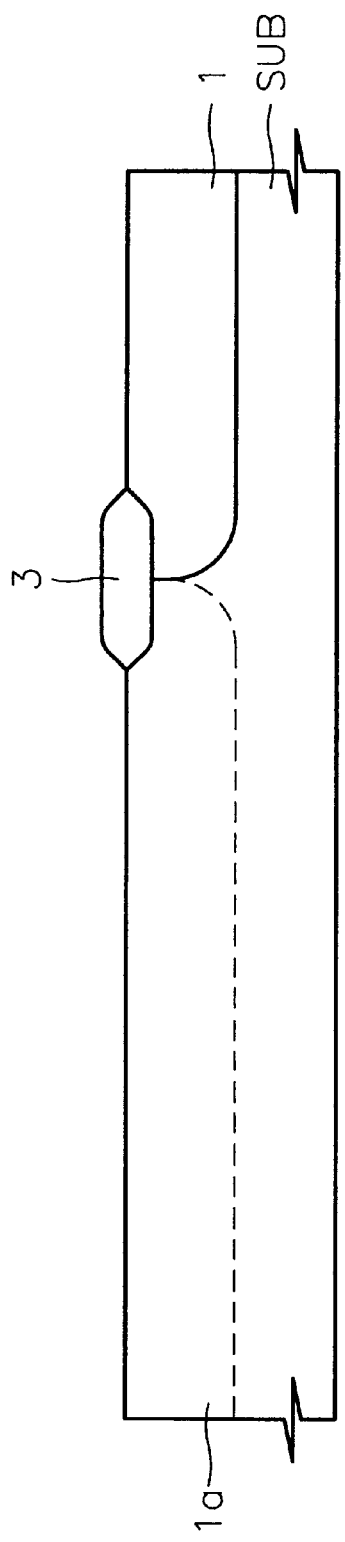

Referring to FIG. 8, a first conductivity type well 1, e.g., an N-type well, is formed on a predetermined area of a semiconductor substrate SUB. Second conductivity type impurities, that is, P-type impurities, are implanted into the region of the semiconductor substrate SUB in an area other than the area where the first conductivity type well 1 is formed, thereby forming a second conductivity type well 1a. If the semiconductor substrate SUB is a P-type, a second conductivity type well 1a may not be formed thereon. Here, the semiconductor substrate SUB serves as the second conductivity type well 1a. Conversely, if the semiconductor substrate SUB is an N-type, the first conductivity type well 1 may not be formed but only the second conductivity type well 1a may be formed. An isolation layer 3 is formed on a predetermined area of the semiconductor substrate where the first and second conductivity type wells 1 and 1a are formed, thereby defining a first active region on the first conductivity type well 1 and a second active region on the second conductivity type well 1a.

Figure 1:
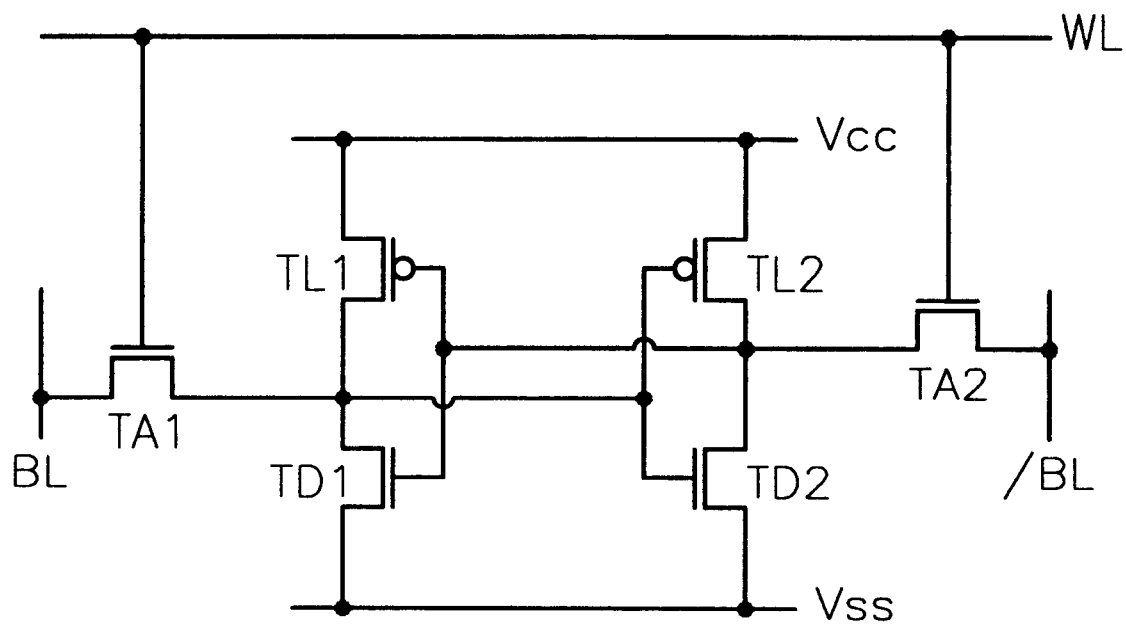
FIG. 1 is a schematic equivalent circuit diagram of a prior art full CMOS SRAM cell.
Figure 9:
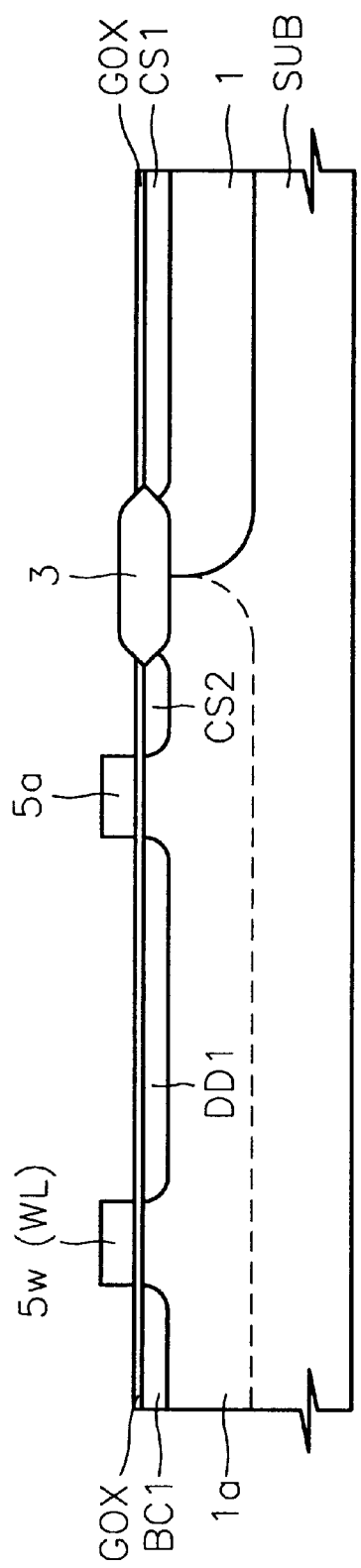

Referring to FIG. 9, a gate insulation layer GOX is formed on the surface of region defined by the isolation layer 3, that is, the first and second active regions. The first active region is defined on the surface of the first conductivity type well 1, and the second active region is defined on the surface of the second conductivity type well 1a. A first conductive layer, e.g., a doped polysilicon layer or polycide layer, is formed over the entire surface of the semiconductor substrate where the gate insulation layer GOX has been formed. The first conductive layer is patterned, thereby forming a word line 5w (corresponding to WL of FIG. 1) traversing the second active region, a first gate electrode 5a and a second gate electrode (not shown). Here, the first and second gate electrodes traverse the first active region.

First conductivity type impurities are selectively implanted into the second conductivity type well 1 a using the word line 5w, the first gate electrode 5a and the second gate electrode as ion implantation masks, thereby forming a first conductivity type impurity region, that is, an N-type impurity region, in the second active region. Here, the N-type impurity regions at both sides of the first gate electrode 5a and the first gate electrode 5a constitute a first driver transistor. The N-type impurity regions at both sides of the word line 5w and the word line 5w constitute a first transfer transistor. Also, although not shown in FIG. 9, the second transfer transistor and the second driver transistor are completed by implanting the first conductivity type impurities.

In FIG. 9, the N-type impurity region between the word line 5w and the first gate electrode 5a serves as a drain region DD1 of the first driver transistor. Also, among the N-type impurity regions at both sides of the first gate electrode 5a, the N-type impurity region facing the drain region DD1 corresponds to a second common source region CS2 shared by the first and second driver transistors. Also, among the N-type impurity regions at both sides of the word line 5w, the N-type impurity region facing the drain region DD1 corresponds to-a-drain region of the first transfer transistor, that is, a first bit line contact region BC1. Here, the drain region DD1 corresponds to not only the drain region of the first driver transistor but also the source region of the first transfer transistor. Likewise, a drain region (not shown) of the second transfer transistor and a second bit line contact region (not shown) are formed in the second active region.

Second conductivity type impurities, that is, P-type impurities, are selectively implanted into the first conductivity type well 1 using the first gate electrode 5a and the second gate electrode as ion implantation masks, thereby forming a P-type impurity region in the first active region. Here, the P-type impurity regions at both sides of the second gate electrode and the first gate electrode 5a constitute a first load transistor (not shown). The P-type impurity regions at both sides of the second gate electrode and the first gate electrode 5a constitute a second load transistor (not shown). Referring to FIG. 9, the P-type impurity region between the first and second gate electrodes serves as a first common source region CS1 shared by the first and second load transistors. Also, although not shown in FIG. 9, drain regions of the first and second load transistors are formed in the first active region.

Figure 10:
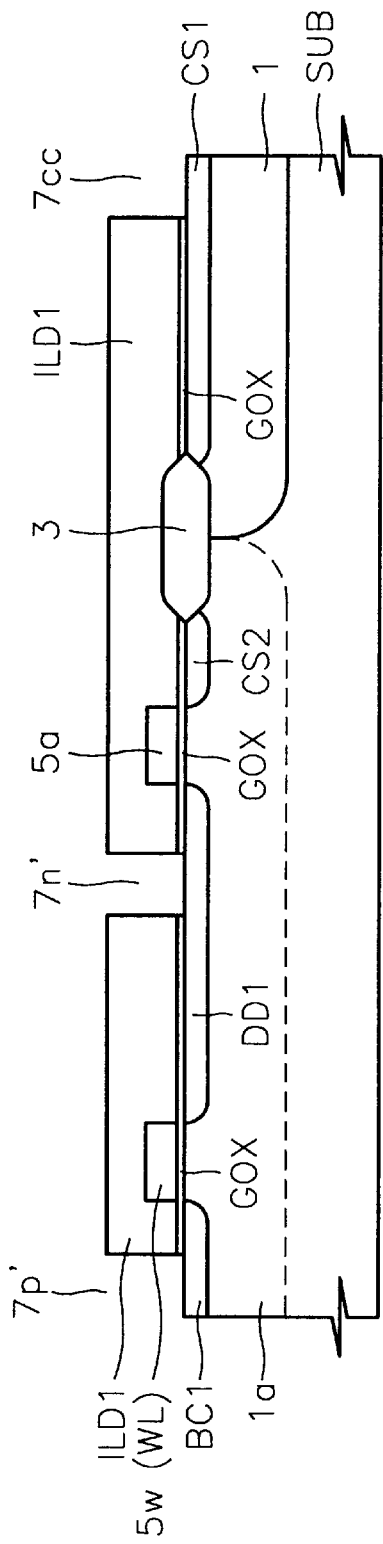

Referring to FIG. 10, a first interlayer dielectric film ILD1 is formed over the entire surface of the semiconductor substrate where the —and P-type impurity regions are formed. The first interlayer dielectric film ILD1 is patterned, thereby forming a first bit line pad contact hole 7p' exposing the first bit line contact region BC1, a first node contact hole 7n' exposing the drain region DD1 of the first driver transistor and a power contact hole 7cc exposing the first common source region CS1. Here, although not shown in FIG. 10, a second bit line pad contact hole exposing a second bit line contact region, a second node contact hole exposing a drain region of a second driver transistor, a ground contact hole exposing a second common source region, a second node contact hole exposing a predetermined region of the first gate electrode 5a, a first node contact hole exposing a predetermined region of the second gate electrode, a first node contact hole exposing a drain region of the first load transistor, and a second node contact hole exposing a drain region of the second load transistor are formed.

Figure 11:
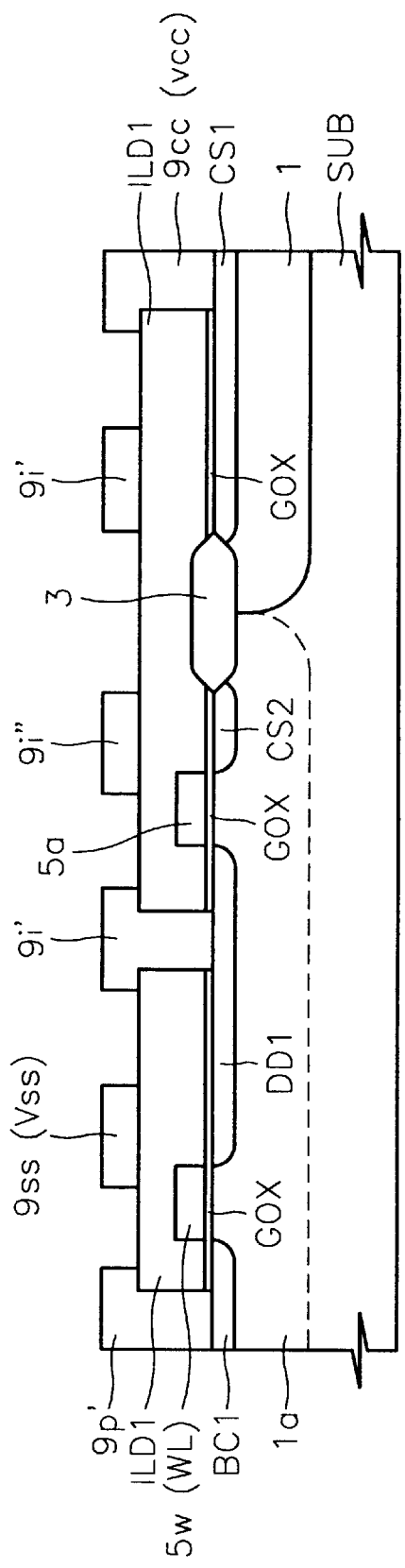

Referring to FIG. 11, a second conductive layer filling the contact holes is formed over the entire surface of the semiconductor substrate where the first and second bit line pad contact holes, first and second node contact holes, the ground contact hole and the power contact hole are formed. The second conductive layer is patterned, thereby forming a first local interconnection 9i' which electrically connects the drain region DD1 of the first driver transistor, the drain of the first load transistor and the second gate electrode to each other, a second local interconnection 9i" which electrically connects the drain region of the second driver transistor, the drain of the second load transistor and the first gate electrode 5a to each other a power line 9cc (Vcc of FIG. 1) electrically connected to the first common source region CS1, a ground line 9ss (Vss of FIG. 1) electrically connected to the second common source region CS2, a first bit line pad 9p' electrically connected to the first bit line contact region BC1, and a second bit line pad (not shown) electrically connected to the second bit line contact region BC2.

Referring to FIG. 12, a second interlayer dielectric film ILD2 is formed over the entire surface of the semiconductor substrate where the first and second local interconnections 9i' and 9i''', the first and second bit line pads 9p' and 9p'', the ground line 9ss and the power line 9cc are formed. The second interlayer dielectric film ILD2 is patterned, thereby forming a first bit line contact hole 11b' exposing the first bit line pad 9p' and a second bit line contact hole (not shown) exposing a second bit line pad.

Referring to FIG. 13, a third conductive layer filling the first and second bit line contact holes, e.g., a metal layer, is formed over the entire surface of the semiconductor substrate where the first and second bit line contact holes are formed. The third conductive layer is patterned, thereby forming a first bit line 13b' electrically connected to the first bit line pad 9p' and a second bit line (not shown). Here, in the case of omitting the process for forming the first and second bit line pad contact holes and the first and second bit line pads, the first and second bit lines are directly connected to the first and second bit line contact regions, respectively.

As described above, according to the present invention, a first gate electrode, a second gate electrode and a word line are formed of a first conductive layer. A first local interconnection, a second local interconnection, a power line and a ground line are formed of a second conductive layer. First and second bit lines are formed of a third conductive layer. Accordingly, only the first and second bit lines as interconnections formed of the third conductive layer exist within a cell pitch. As a result, the pitch of a bit line can be maximized, thereby improving the operating speed of a full CMOS SRAM cell.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A full complementary metal oxide semiconductor (CMOS) static random access memory (SRAM) cell comprising:

first and second active regions formed in a semiconductor substrate, the first active region having an approximate "T" shape and the second active region having an approximate inverted "T" shape symmetrical with the first active region, the second active region including extending portions which extend from ends of both wings of the approximate inverted "T" shape in a direction opposite to the first active region;

a word line traversing first and second areas of the second active region;

first and second gate electrodes arranged to be perpendicular to the word line, wherein the first and second gate electrodes are parallel to each other and traverse the first and second active regions, respectively;

a power line electrically connected to a first common source region and arranged parallel to the word line, the first common source region being the first active region between the first gate electrode and the second gate electrode;

a ground line electrically connected to a second common source region and arranged parallel to the word line, the second common source region being the second active region between the first gate electrode and the second gate electrode; and first and second bit lines arranged to be perpendicular to the word line and parallel to each other.

2. The full CMOS SRAM cell according to claim 1, wherein the first and second active regions are formed in a first conductivity type well and a second conductivity type well, a respectively.

3. The full CMOS SRAM cell according to claim 2, wherein the first and second conductivity types are an N-type and a P-type, respectively.

4. The full CMOS SRAM cell according to claim 1, wherein the word line traverses the extending portions of the second active region.

5. The full CMOS SRAM cell according to claim 1, wherein the word line and the first and second gate electrodes are formed of a first conductive layer.

6. The full CMOS SRAM cell according to claim 5, wherein the ground line and the power line are formed of a second conductive layer.

7. The full CMOS SRAM cell according to claim 6, wherein the first and second bit lines are formed of a third conductivity layer.

8. The full CMOS SRAM cell according to claim 5, further comprising:

a first local interconnection for electrically connecting a portion of the second active region, a portion of the first active region and the second gate electrode, wherein the part of the second active region faces the second common source region among the second active regions at both sides of the first gate electrode and the part of the first active region faces the first common source region among the first active region at both sides of the first gate electrode; and a second local interconnection for electrically connecting a portion of the second active region, a portion of the first active region and the first gate electrode, wherein the part of the second active region faces the second common source region among the second active regions at both sides of the second gate electrode and the part of the first active region faces the first common source region among the first active region at both sides of the second gate electrode.

9. The full CMOS SRAM cell according to claim 8, wherein the first and second local interconnections are formed of a second conductive layer.

10. The full CMOS SRAM cell according to claim 9, wherein the first and second bit lines are formed of a third conductive layer.

* * * * *